(12) United States Patent
Minelli et al.

(10) Patent No.: US 6,282,097 B1
(45) Date of Patent: Aug. 28, 2001

(54) DATA CARD HAVING A RETRACTABLE HANDLE

(75) Inventors: Jeffrey D. Minelli, Olathe; David Laverick, Overland Park, both of KS (US)

(73) Assignee: Garmin Corporation (TW)

( * ) Notice: Subject to any disclaimer, the term of this patent is extended or adjusted under 35 U.S.C. 154(b) by 0 days.

(21) Appl. No.: 09/181,686

(22) Filed: Oct. 28, 1998

(51) Int. Cl.$^7$ .................................. H05K 7/10; H05K 7/14
(52) U.S. Cl. .................... 361/728; 361/740; 361/801; 439/928.1; 16/115
(58) Field of Search .................. 361/685, 686, 361/684, 728, 730, 752, 801, 814, 736, 737, 740; 16/115; 439/484, 928.1; 312/332.1

(56) References Cited

U.S. PATENT DOCUMENTS

| | | | |
|---|---|---|---|
| 4,138,711 | 2/1979 | Bremenour et al. | 361/424 |
| 4,531,176 | 7/1985 | Beecher, II | 361/424 |
| 4,780,604 | 10/1988 | Hasegawa et al. | 235/491 |
| 4,780,791 | 10/1988 | Morita et al. | 361/395 |
| 4,780,793 | 10/1988 | Ohtsuki | 361/399 |
| 4,868,715 | 9/1989 | Putman et al. | 361/422 |
| 4,872,091 | 10/1989 | Maniwa et al. | 361/424 |
| 4,905,124 | 2/1990 | Banjo et al. | 361/395 |
| 4,906,057 | 3/1990 | Davi et al. | 312/193 |
| 4,955,817 | 9/1990 | Sugai | 439/60 |
| 4,956,756 | 9/1990 | Hsiao | 362/226 |
| 4,974,120 | 11/1990 | Kodai et al. | 361/392 |
| 5,017,767 | 5/1991 | Mizuno | 235/492 |
| 5,031,076 | 7/1991 | Kiku | 361/424 |
| 5,053,613 | 10/1991 | Onoda | 235/492 |
| 5,061,845 | 10/1991 | Pinnavaia | 235/492 |
| 5,068,765 | 11/1991 | Nimpoeno | 361/422 |
| 5,151,774 | 9/1992 | Mori et al. | 357/79 |
| 5,153,818 | 10/1992 | Mukougawa et al. | 361/395 |
| 5,161,169 | 11/1992 | Galano et al. | 375/8 |
| 5,173,840 | 12/1992 | Kodai et al. | 361/395 |
| 5,193,220 | * 3/1993 | Ichinohe et al. | 455/89 |
| 5,229,925 | 7/1993 | Spencer et al. | 361/422 |
| 5,288,237 | 2/1994 | Mizutani et al. | 439/76 |
| 5,309,323 | 5/1994 | Gray et al. | 361/726 |
| 5,319,516 | 6/1994 | Perkins | 361/220 |
| 5,330,360 | 7/1994 | Marsh et al. | 439/76 |
| 5,335,145 | 8/1994 | Kusui | 361/737 |
| 5,339,222 | 8/1994 | Simmons et al. | 361/818 |
| 5,357,402 | 10/1994 | Anhalt | 361/753 |
| 5,375,037 | 12/1994 | Le Roux | 361/684 |
| 5,386,340 | 1/1995 | Kurz | 361/737 |
| 5,397,857 | 3/1995 | Farquhar et al. | 174/52.1 |
| 5,408,385 | 4/1995 | Fowler et al. | 361/784 |
| 5,414,253 | 5/1995 | Baudouin et al. | 235/492 |
| 5,440,448 | 8/1995 | Stewart et al. | 361/684 |
| 5,440,451 | 8/1995 | Saito et al. | 361/760 |
| 5,446,622 | 8/1995 | Landry et al. | 361/737 |
| 5,526,235 | 6/1996 | Beason et al. | 361/799 |
| 5,528,453 | * 6/1996 | Berman et al. | 361/625 |
| 5,530,620 | * 6/1996 | Sangveraphunsiri | 361/686 |
| 5,552,240 | * 9/1996 | Dertine | 439/96 |
| 5,694,298 | 12/1997 | Chabert et al. | 361/798 |
| 5,741,055 | * 4/1998 | Chen | 361/685 X |
| 5,843,595 | * 12/1998 | Kawakatsu | 439/97 |
| 5,911,589 | * 6/1999 | Chen | 361/685 X |
| 5,947,572 | * 9/1999 | Chen | 312/332.1 |

FOREIGN PATENT DOCUMENTS

WO 90/16046  12/1990  (WO) .

* cited by examiner

*Primary Examiner*—Jayprakash N. Gandhi
(74) *Attorney, Agent, or Firm*—Devon A. Rolf

(57) ABSTRACT

A data card having a retractable handle is disclosed. In the preferred embodiment, the data card includes an electronic data storage medium contained within a two-piece protective housing. A removable handle is slidably engaged with the housing and is movable between a stored position, wherein the handle does not extend beyond the housing, and an active position, wherein the handle is extended beyond the housing for easy manipulation by the user.

15 Claims, 1 Drawing Sheet

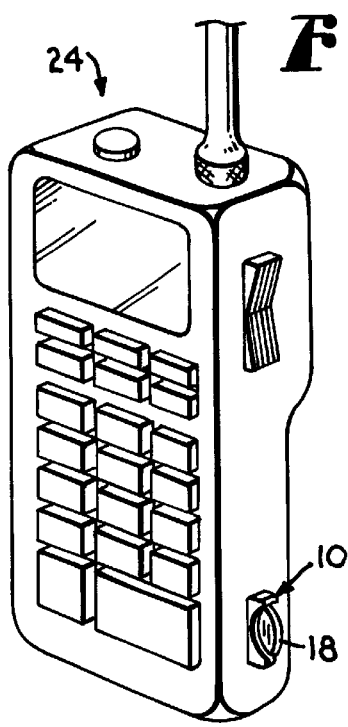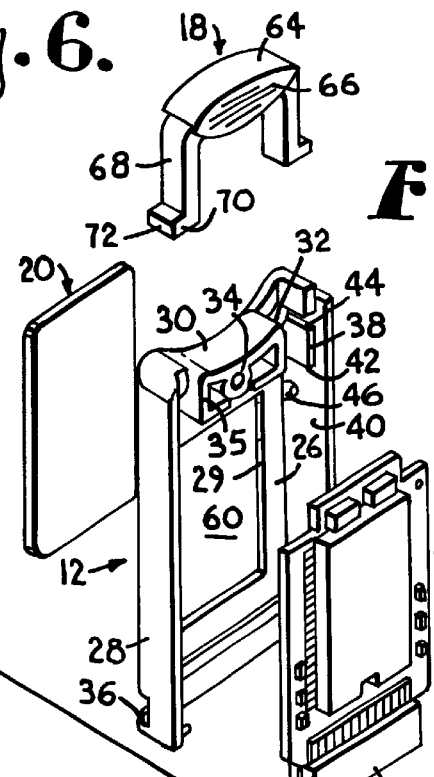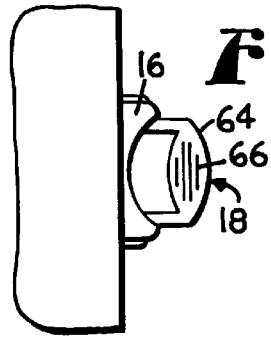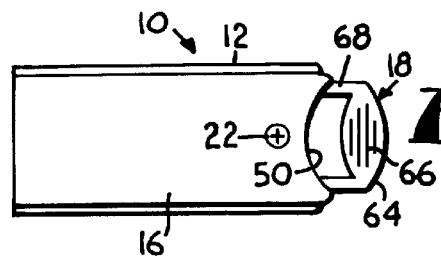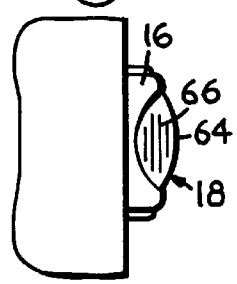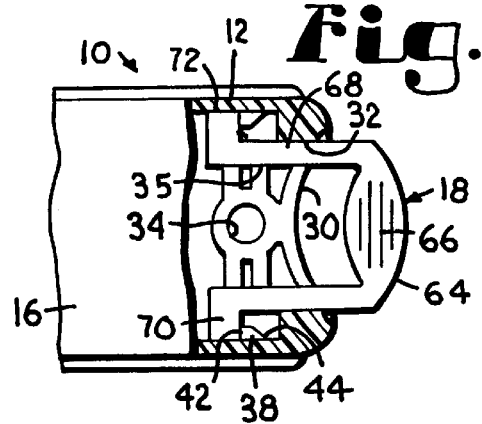

DATA CARD HAVING A RETRACTABLE HANDLE

BACKGROUND OF THE INVENTION

The present invention relates to electronic storage media and, more particularly, to a data card having a retractable handle for use in connection with electronic devices.

The utilization of electronic devices has become pervasive in our society. As the need for electronic devices grows, the consuming public demands smaller and more portable devices to promote their convenient utilization. A significant drawback associated with minimizing the size and weight of electronic devices is the countervailing need to provide increasing memory capabilities. The constantly expanding memory requirements of electronic devices often impedes or precludes a manufacturer's ability to reduce the size and weight of the devices.

In recent years, though, removable electronic storage media have been developed to expand the functions of electronic devices. Such storage media are small and lightweight. They are adapted to be selectively interchangeable in the device so that the device's memory can be selectively augmented to perform a particular application. Perhaps most common among these media are magnetic tapes, floppy disks and their associated drives, which are often used in connection with personal computers. In other, more portable devices where damage to the electronic storage media is a more significant threat, the media is often placed within a protective shell or housing so that when the storage media is not in use with its associated device, the media is protected from external environmental conditions and physical damage.

One increasingly common form of such protective electronic storage devices are data cards. Data cards are well known in the art and typically include a small hard plastic housing for containing the data storage medium. The cards can be interchangeably inserted within the device and easily replaced to provide the device with virtually limitless memory. To add memory, the user need only insert a new data card suited to the particular application. Data cards are particularly useful for hand-held devices where portability is critical, such as with navigation and avionics devices. However, a significant problem has arisen relating to the use of data cards in portable electronic devices.

It is inherent in utilization of a data card that it be configured so that the user can grasp the card to insert and remove it from the device when necessary. This configuration necessitates that a portion of the data card extend beyond the device so that it may be grasped. The projection of the data card from the device is not aesthetically pleasing. More importantly, this extension of the data card from the device is likely to be bumped or snagged, thereby damaging the data card and the storage media contained therein. If the device is in use, any physical contact with the data card could impede the functioning of the device or, even worse, cause the device to become nonfunctional. Ironically, the primary utility of the data card—its interchangeability—is also its primary drawback.

A variety of current designs for data cards have proved somewhat satisfactory in overcoming this drawback These designs usually entail the substantially complete insertion of the data card into the device so that it presents a relatively flush profile with the outer surface of the device. This flush configuration, however, makes it difficult for the user to manipulate the card to remove it and replace it when necessary. While the flush configuration is desirable for aesthetic reasons and to protect the media contained in the data card, the flush configuration has created significant problems in actually using the data card. If the data card cannot be removed, the practical memory capacity of the device is basically limited to a single card and, thus, the overall utility of the device is substantially reduced.

SUMMARY OF THE INVENTION

It is therefore an object of the present invention to provide a data card that provides the aesthetic and protective advantages of a flush configuration while also permitting easy removal and replacement of the data card by the user.

More particularly, it is an object of the present invention to provide a data card having a retractable handle so that the data card presents a flush configuration with the electronic device when the handle is stored but provides an easily manipulatable profile when the handle is extended for easy removal by the user.

Thus, it is an object of the present invention to provide a data card having a handle movable between a first position, wherein the handle is slidably retracted into the data card, and a second position, wherein the handle is extended from the data card.

It is another object of the present invention is to provide a data card that is substantially flush with the outer surface of the device when the data card is inserted and the handle is in its stored position so that the data card does not present a source of physical obstruction outside the device.

It is also an object of the present invention to provide a data card having a housing that protects the storage media from external environmental exposure and physical contact by the user or other objects.

Another object of the present invention is to provide a data card that may be easily disassembled to provide access to the electronic storage media contained therein for repair or replacement by the user.

To accomplish these and other related objects of the present invention, a data card having a retractable handle is disclosed. In the preferred embodiment, the data card includes an electronic data storage medium contained within a two-piece protective housing. A removable handle is slidably engaged with the housing and is movable between a stored position, wherein the handle does not extend beyond the housing, and an active position, wherein the handle is extended beyond the housing for easy manipulation by the user.

DESCRIPTION OF THE DRAWINGS

The accompanying drawings form part of the specification and are to be read in conjunction with this disclosure.

FIG. 1 is an exploded perspective view of the data card of the present invention showing its constituent components;

FIG. 2 is a front view of a data card constructed in accordance with the present invention showing the retractable handle extended from the housing;

FIG. 3 is a fiagmentary front view of the data card shown in FIG. 2 inserted into an electronic device;

FIG. 4 is an enlarged fragmentary front view of the data card shown in FIG. 2, parts being broken away to reveal details of construction;

FIG. 5 is a fragmentary front view of the data card shown in FIG. 3 but with the retractable handle in its stored position; and FIG. 6 is a perspective view of an electronic device having a data card constructed in accordance with the invention inserted therein.

DESCRIPTION OF THE PREFERRED EMBODIMENT

Turning now to the drawings, and initially to FIGS. 1 and 6, a data card constructed in accordance with the present invention is broadly designated by the numeral 10. As best seen in FIG. 1, data card 10 generally includes four components: a housing 12, an electronic data storage medium 14, a cover 16 and a handle 18. A label 20 may be applied to housing 12 or cover 16 to identify the data on the storage medium 14. A screw 22 preferably is used to secure the components of the data card 10 together. FIG. 6 illustrates the data card 10 inserted into a portable electronic device 24.

Housing 12 provides the bulk of the physical structure of data card 10. Housing 12 is generally rectangular in shape, but it is to be understood that any shape can be utilized without departing from the scope of the present invention. Housing 12 includes a planar body 26 and opposed sidewalls 28. Body 26 preferably includes at least one corrugation 29 to enhance the rigidity and strength of the body 26. Housing 12 includes a top wall 30 and an open end opposite top wall 30. The top wall 30 of housing 12 is generally convex and includes lateral openings 32 adjacent sidewalls 28. Below top wall 30 is a threaded aperture 34 for receiving screw 22. Aperture 34 is substantially surrounded by a support ridge 35 for strengthening the area of housing 12 around aperture 34. A detent opening 36 is disposed at the bottom portion of each sidewall 28. A braking block 38 is positioned on the inner surface 40 of each side wall 28 near top wall 30. Block 38 is generally trapezoidal in form, having a squared lower end 42 and tapered upper end 44. A plurality of spacers 46 also are disposed on the inner surfaces 40 of side walls 28.

Cover 16 is also planar and congruent to, but slightly smaller than housing 12. The lateral perimeter of cover 16 is sized to abut inner surfaces 40 of side walls 28. Lateral lips 48 project from the sides of cover 16 and are adapted to fit adjacent inner surfaces 40 of side walls 28 when cover 16 is secured to housing 12. Cover 16 is maintained a specified distance from the body 26 of housing 12 by spacers 46, blocks 38 and ridge 35. Cover 16 has a convex upper edge 50 coextensive with top wall 28 of housing 12. A pair of latches 52 are disposed at the bottom corners of the cover 16. Each latch 52 includes a resilient neck 54 and outwardly turned hooks 56 alignable with and adapted to securely engage detent openings 36 on housing 12. Necks 56 bias hooks 56 outwardly to maintain their engagement with openings 36. An orifice 58 is defined in the upper portion of cover 16 and is positioned to be aligned with aperture 34 when cover 16 is secured to housing 12. Thus, cover 16 is secured to housing 12 by two mechanisms: First, the latches 52 secure the bottom portion of cover 16 to the bottom portion of housing 12 by engagement of the opposed hooks 56 into the detent openings 36 of the housing 12; second, screw 22 is sized to be received through orifice 58 and into the threaded aperture 34 of housing 12. The two-fold attachment of cover 16 to housing 12 provides a reliable, but selectively removable engagement for easy access by the user for repair or replacement of medium 14. When secured in this fashion, cover 16 and housing 12 define an internal cavity 60.

The electronic data storage medium 14 is adapted to be received within cavity 60. Storage medium 14 is mounted to housing 12 by any suitable means, such as gluing. Medium 14 may take many forms depending upon the level of function required and the size and weight limitations of the device. Typically, storage medium 14 will be in the form of a computer chip storing electronic data. It is to be understood, however, that storage medium 14 can be the form of any medium capable of storing electronic data or information. Storage medium 14 preferably is constructed to conform to the general configuration of cavity 60. Storage medium 14 preferably includes an electrical connector 62 at the bottom portion of medium 14. This electrical connector 62 is adapted to selectively releasably engage a corresponding electronic reader on the device so that the electronic reader can extract data from the medium 14. Electronic connector 62 may be of any design conventional in the art so long as it can engagably mate and provide data to the electronic reader of the device.

Handle 18 is generally U-shaped. Handle 18 includes a transverse grip 64 having opposed frictional engaging surfaces 66. Preferably, the frictional engaging surfaces 66 of handle 18 comprise lateral grooves. It is to be understood, however, that other frictional engaging surfaces are contemplated by this invention and is within its scope. Handle 18 includes resilient parallel arms 68 spaced to be received within lateral openings 32 of top wall 30. Arms 68 are spaced a sufficient distance apart so that they do not contact storage medium 14 within housing 12 when handle 18 is in stored position. Arms 50 terminate in outwardly opposed shoulders 70 having outer edges 72. The distance between outer edges 72 preferably is slightly larger than the distance between inner surfaces 40 of sidewalls 28.

The manner by which handle 18 is secured to housing 12 is best seen in FIG. 4. Arms 68 are slidably received within lateral openings 32 of housing 12. In stored position, shoulders 70 extend below the squared lower ends 42 of blocks 38. Outer edges 72 of shoulders 70 bias against the inner surfaces 40 of housing 12 by the resiliency of arms 68 to provide a frictional engagement. Blocks 38 prevent undesired outward movement of the handle 18. The grip 64 of handle 18 abuts the top wall 30 of housing 12 to prevent further movement of handle 18 into housing 12.

The grip 64 is pulled by the user to place handle 18 in active position. In active position, the handle 18 extends from housing 12 so that it may be easily grasped by the user. As the handle 18 is pulled outwardly, outer edges 72 of shoulders 70 slide over blocks 38. The squared lower end 42 of blocks 38 provide some resistance to movement, but the resistance is not so great as to prevent movement of the handle 18 upon moderate pulling. The outer edges 72 of shoulders 70 then slide over blocks 38. The resiliency of arms 68 biases outer edges 72 against blocks 38 to provide limited frictional resistance so that the handle 18 cannot slide freely about. When the outer edges 72 reach the tapered upper ends 44 of blocks 38, the resistance to movement subsides and the angle of the incline presses handle 18 outwardly to the active position, wherein shoulders 70 abut the top wall 30 of housing 12.

In operation, the user first selects the appropriate data card containing the necessary electronic information for the electrical device 24. As noted above, the data card 10 preferably is generally rectangular in shape. Therefore, the electrical device 24 in which the data card 10 is to be used should have a corresponding rectangular bay in which the data card 10 may be slidably inserted. It is to be understood, of course, other shapes of data cards would require other corresponding configurations of receiving bays.

After selection of the desired data card 10, the user grasps handle 18 by placing his or her fingers at the frictional engaging surfaces 66 of grip 64. The data card 10 is then inserted into the receiving bay of the electrical device 24. The data card 10 is inserted into the bay until the electrical connectors 62 of the storage medium 14 engage the electrical reader of the device 24. Preferably, this engagement will allow the data card 10 to be substantially completely received in the bay. When completely inserted, it is preferable that the handle 18 of the data card 10 be substantially flush with the outer surface of the device 24 when the handle 18 is in stored position. Of course, it is necessary that some portion of the handle 18 be exposed so that the user may grasp it to remove the data card 10. Thus, some portion of the handle 18 may extend beyond the device 24. A more complete flush configuration may be achieved by providing a recess in the device surrounding the receiving bay. Such configuration is within the scope of the present invention.

When the user desires that the data card be removed, the user may grasp grip 64 of handle 18 and apply pulling force to the data card 10. Initially, the handle 18 will move outwardly relative to housing 12 until it reaches its active position, as seen in FIG. 3. Once in its active position, the shoulders 70 about top wall 30. At that point, the handle 18 ceases its relative movement and the data card 10 may be pulled from the receiving bay of the device 24. After complete removal of the card 10, the user may replace the data card with another card using the same procedure.

The retractable handle 18 of the data card 10 of the present invention allows the card 10 to be easily inserted and removed by the user. The retractable nature of handle 18 allows the data card 10 to have a convertible external profile, either a stored position wherein the handle 18 is essentially flush with the outer surface of the device 12, or an active position wherein the handle 18 is extended so that it can be easily grasped by the user. In the stored position, the data card 10 can be substantially concealed within the device 24. Outer environmental conditions or external contact is virtually prohibited. Alternatively, when the data card 10 must be removed from the device, the retractable handle 18 can be pulled into the active position and the data card can be easily removed. The flush configuration of the data card is aesthetically pleasing and highly functional. The retractable handle of the data card preserves the advantages of this flush configuration while achieving ease of interchangeability.

From the foregoing, it will be seen that this invention attains all the ends and objectives of the invention. Various modifications to the invention may be made without departing from its scope. It will be understood that certain features and subcombinations are of utility and may be employed without reference to other features and subcombinations. This is contemplated by and is within the scope of the disclosure. It is to be understood that all matters set forth herein shall be interpreted as illustrative only and not in a limiting sense.

We claim:

1. An electronic data storage device comprising:
   a medium for storing electronic data;
   structure surrounding said medium, said structure having opposed first and second ends, wherein said structure defines a longitudinal axis extending between said first and second ends;
   an electrical connector connected to said medium, said electrical connector positioned at said first end of said structure and accessible from an exterior thereof; and
   a retractable handle coupled with said structure at said second end thereof, said handle being movable along said longitudinal axis between a stored position and an active position, wherein said handle remains coupled to said structure when said handle is in said active position.

2. The electronic data storage device as recited in claim 1, said structure further including a housing, said housing defining a cavity, wherein said storage medium is mounted within said cavity.

3. The electronic data storage device as recited in claim 2, said housing further including a cover.

4. The electronic data storage device as recited in claim 3, said structure further including a label fixedly attached to said housing.

5. The electronic data storage device as recited in claim 3, said structure further including a label fixedly attached to said cover.

6. The electronic data storage device as recited in claim 1, wherein said storage device comprises a data card, said data card adapted for use in connection with an electronic device.

7. The electronic data storage device as recited in claim 1, in combination with an electrical device, said electrical device having a bay therein for receiving the data storage device.

8. The electronic data storage device as recited in claim 7, wherein the data storage device is insertable into said bay to a position wherein said handle is in said stored position, and wherein the data storage device is removable from said bay by applying a first force to said handle causing said handle to move into said active position and subsequently applying a second additional force to said handle in a longitudinal direction away from said electrical device.

9. An electronic data storage device comprising:
   a medium for storing electronic data;
   structure surrounding said medium, said structure having opposed first and second ends, wherein said structure defines a longitudinal axis extending between said first and second ends;
   an electrical connector connected to said medium, said electrical connector positioned at said first end of said structure and accessible from an exterior thereof, and
   a retractable handle coupled with said structure at said second end thereof, said handle being movable along said longitudinal axis between a stored position and an active position, wherein said handle is U-shaped having a transverse grip and two substantially parallel arms extending from opposed ends of said grip.

10. The electronic data storage device as recited in claim 9, said housing including:
    first and second ends positioned to correspond with said first and second ends of said structure; and
    an upper wall positioned at said second end of said housing, said upper wall having lateral openings adapted to receive said parallel arms in sliding relationship.

11. The electronic data storage device as recited in claim 10, wherein said grip of said handle is proximate said upper wall when said handle is in the stored position.

12. The electronic data storage device as recited in claim 11, wherein said grip of said handle is spaced from said upper wall when said handle is in the active position.

13. The electronic data storage device as recited in claim 9, said housing further including at least one braking member disposed on an inner surface thereof.

14. The electronic data storage device as recited in claim 13, wherein said arms of said handle include outwardly projecting shoulders.

15. The electronic data storage device as recited in claim 14, wherein said shoulders are adapted to contact said braking member when said handle is in the stored position, thereby preventing outward movement of the handle.

* * * * *